US005151774A

United States Patent [19]

Mori et al.

[11] Patent Number: 5,151,774

[45] Date of Patent: Sep. 29, 1992

[54] PORTABLE SEMICONDUCTOR DATA STORAGE DEVICE WITH DISCONNECTABLE GROUND CONNECTION

[75] Inventors: Yoshihide Mori, Kawanishi; Takayuki Shinohara, Itami, both of Japan

[73] Assignee: Mitsubishi Denki Kabushiki Kaisha, Japan

[21] Appl. No.: 687,062

[22] Filed: Apr. 18, 1991

[30] Foreign Application Priority Data

Oct. 31, 1990 [JP] Japan .................................. 2-291919

[51] Int. Cl.[5] ...................... H01L 23/42; H01L 23/44

[52] U.S. Cl. ........................................ 357/79; 357/74; 357/68; 235/441; 235/492; 361/395; 361/397; 361/413

[58] Field of Search ............................ 357/79, 74, 68; 235/488, 492, 441, 444; 361/413, 394, 395, 397, 400

[56] References Cited

U.S. PATENT DOCUMENTS 4,675,516 6/1987 Guion .................................. 235/441
4,780,791 10/1988 Morita et al. ........................ 361/395
4,887,188 12/1989 Yoshida et al. ...................... 361/413
5,016,086 5/1991 Inoue et al. ........................... 357/74
5,049,728 9/1991 Rovin .................................. 235/492

FOREIGN PATENT DOCUMENTS 648877 2/1964 Japan .

*Primary Examiner*—Rolf Hille
*Assistant Examiner*—David Ostrowski
*Attorney, Agent, or Firm*—Leydig, Voit & Mayer

[57] ABSTRACT

In a portable semiconductor storage device, a negative electrode terminal electrically connected to the circuit ground of a board contained in the portable semiconductor storage device contacts both the negative polarity of a cell and conductive outer plates on both sides of the circuit board when the cell is present in the device. When the cell is not present, the circuit ground of the board is not brought into contact with the conductive outer plates. Therefore, backup data can be protected from being destroyed due to external noise when the cell is present, and ground superimposed noise from the conductive outer plates can be cut off when the cell is not present, aiding in the stable operation of the entire system. Since the circuit ground is connected to the conductive outer plates by means of a terminal member of a simplified constuction, an assembly process can be simplified. Thus, the present invention has an advance in that the reliability of the portable semiconductor storage device is enhanced and the cost is lowered.

4 Claims, 2 Drawing Sheets

PORTABLE SEMICONDUCTOR DATA STORAGE DEVICE WITH DISCONNECTABLE GROUND CONNECTION

BACKGROUND OF THE INVENTION

1. Field of the Invention

The present invention relates to a portable semiconductor storage device.

2. Description of the Related Art

FIG. 4 is a schematic cross-sectional view illustrating a conventional portable semiconductor storage device, for example, a memory card, which is disclosed in Japanese Published Patent Application 64-8877. FIG. 5 is a perspective view of the memory card. In FIGS. 4 and 5, a memory card main body 1 is sandwiched between conductive outer plates 2 and 3 which oppose each other. A printed board 4, on which semiconductor storage devices such as RAMs and ROMs (not shown) are mounted along with peripheral circuit devices (not shown), is housed in the memory card main body 1. Also, a terminal section 5 for making an electrical connection with external circuits is disposed in the memory card main body 1. The circuit ground (not shown) of the printed board 4 is connected to the conductive outer plates 2 and 3 via a ground member 6 and a ground spring 7. As a power source for the printed board 4, a cell 8 is housed in a cell holder 9 in the cell housing area 10 of the memory card main body 1.

The conventional portable semiconductor storage device is constructed as described above. The conductive outer plates 2 and 3 are connected to the circuit ground of the printed board 4 via the ground member 6 and the ground spring 7. The memory card main body 1 is constructed with the printed board 4, on which semiconductor storage devices are mounted, shielded from the ground. For this reason, this construction is effective in preventing data loss due to external noise, as well as the destruction of the storage device itself.

In the above-described portable semiconductor storage device, when a data backup function of a cell is required in a single device, the conductive outer plates 2 and 3 are connected to the circuit ground of the printed board 4. Therefore, the portable semiconductor storage device has a strong construction against data destruction due to external noise. However, when this device is mounted in a system, external noise is transmitted as ground superimposed noise. For this reason, an adverse influence on the stable operation of the entire system cannot be avoided. A problem arises, particularly in a case where the device is used in an application taking on an important function such as extended memory rather than data backup.

Also, the conventional construction of this device, the construction in which the conductive outer plates 2 and 3 are connected to the circuit ground of a board contained in the device, is complex. Thus, a problem arises, namely, mounting space and an assembly process for that connection are required.

SUMMARY OF THE INVENTION

The present invention has been devised to solve the above-mentioned problem. An object of the present invention is to provide a portable semiconductor storage device in which a simplified construction is realized where the conductive outer plates of the portable semiconductor storage device are connected to the circuit ground of the board contained in the device, and which is capable of switching the connection/non-connection between the conductive outer plates and the circuit ground of the integral board depending upon its application.

The portable semiconductor storage device of the present invention comprises a board on which semiconductor devices are mounted and including a circuit ground; a pair of conductive outer plates disposed on opposite sides of the board; means electrically connecting the conductive outer plates; and terminal members for electrically connecting the negative terminal of a cell to the conductive outer plates and the circuit ground when the cell is present between the outer plates, and for electrically disconnecting the conductive outer plates from the circuit ground when the cell is not present between the outer plates.

DESCRIPTION OF THE PREFERRED EMBODIMENT

Figure 1:
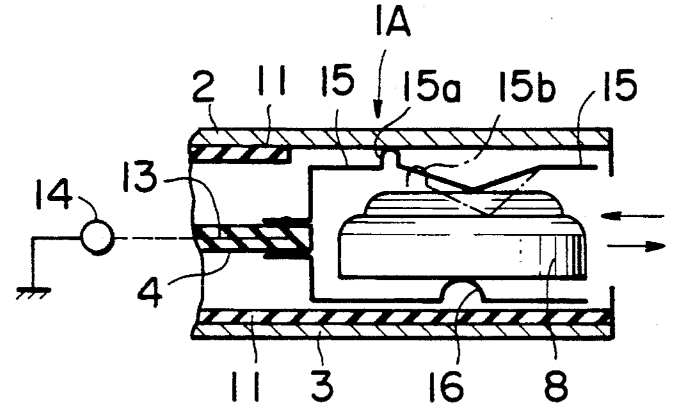
FIG. 1 is a schematic cross-sectional view illustrating a portion of a portable semiconductor storage device according to an embodiment of the present invention.
Figure 2:
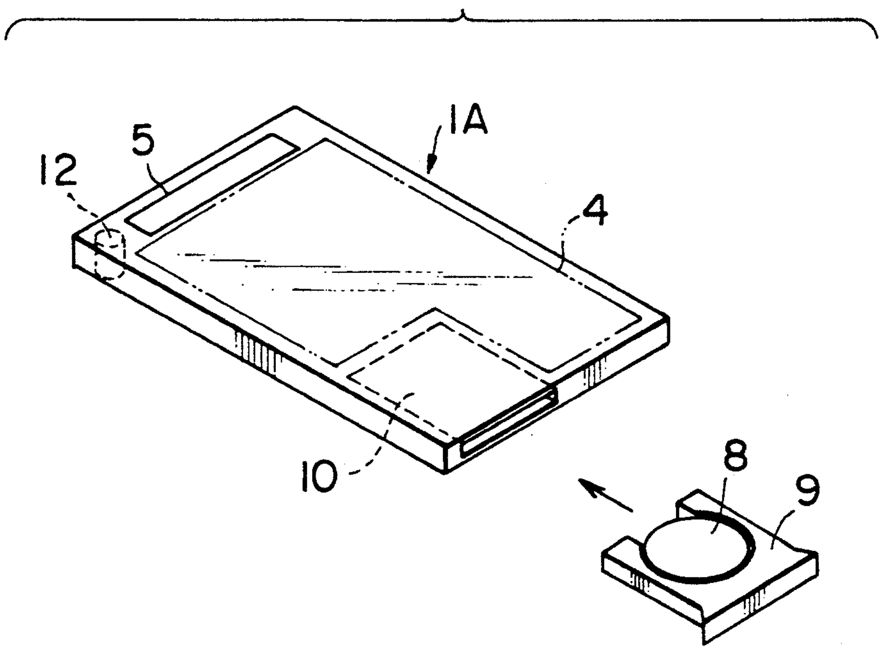
FIG. 2 is a perspective view of the portable semiconductor storage device shown in FIG. 1.

FIG. 1 is a schematic cross-sectional view illustrating a portion of a portable semiconductor storage device according to an embodiment of the present invention, for example, a memory card main body in which volatile memory is contained. FIG. 2 is a perspective view of the portable semiconductor storage device shown in FIG. 1. In FIGS. 1 and 2, reference numerals 2 to 4, 8, and 9 are exactly the same as those in the above-described conventional portable semiconductor storage device. An insulating material 11 is disposed in the inner surfaces of the conductive outer plates 2 and 3 of the memory card main body 1A in a close-contact manner. The conductive outer plates 2 and 3 are connected to the same electrical potential by means of a conductive spring 12 outside the area of the built-in printed board 4. A circuit ground (GND) 13 disposed on the printed board 4 is connected to the ground terminal 14 in the terminal section of the memory card main body 1A. This ground terminal 14 is connected to the circuit ground of a system when the memory card main body 1A is inserted into the system (not shown).

Figure 3:
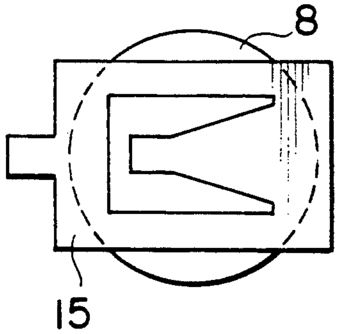
FIG. 3 is a top plan view illustrating a negative electrode terminal.
Figure 4:
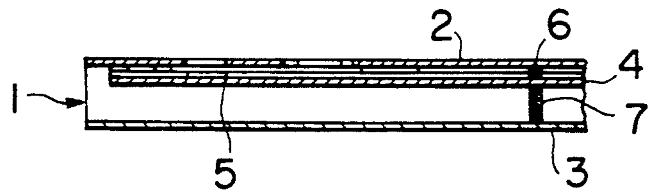
FIG. 4 PRIOR ART
FIG. 4 is a schematic cross-sectional view illustrating a conventional portable semiconductor storage device.
Figure 5:
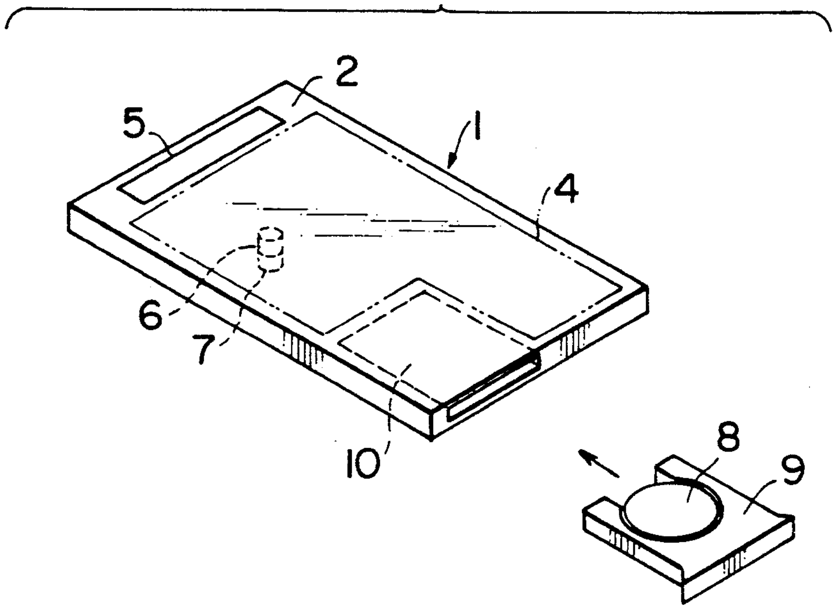
FIG. 5 PRIOR ART
FIG. 5 is a perspective view of the portable semiconductor storage device shown in FIG. 4.

A negative electrode terminal 15, which is a terminal member, contacts both the negative terminal of a cell 8 for memory backup and the conductive outer plates 2 and 3 in a state **15*a* when the cell 8 is present in the memory card main body 1A. Terminal 15 is electrically connected to the circuit ground 13 by being soldered on the printed board 4. In contrast to this, in a state 15*b* when the cell 8 is not present in the memory card, the negative electrode terminal 15 is disconnected from the conductive outer plates 2 and 3, with the result that the circuit ground 13 does not contact the conductive outer plates 2 and 3. The top plan view of the negative electrode terminal 15 is shown in FIG. 3. Meanwhile, a positive electrode terminal 16 contacts the positive terminal of the cell 8 and is connected to a power source (not shown) for volatile memory backup mounted on the printed board 4** by being soldered to the power source.

In the portable semiconductor storage device constructed as described above, when the cell 8 is present in the memory card main body 1, the conductive outer plates 2 and 3 are electrically connected to the circuit ground 13 similarly to the conventional portable semiconductor storage device. For this reason, when data backup is provided by means of the cell 8 when the card is an independent portable semiconductor storage device, the conductive outer plates 2 and 3 are connected to the circuit ground 13 and strongly resist loss of backup data due to external noise. In contrast to this, when the cell 8 need not be loaded into the memory card main body 1A, the negative electrode terminal 15 is electrically disconnected from the conductive outer plates 2 and 3. Hence, the circuit ground 13 is floating relative to the conductive outer plates 2 and 3. Ground noise superimposed from the outer casing of the portable semiconductor storage device can be reduced, aiding in the stable operation of the entire system.

As described above, regarding the portable semiconductor storage device of the present invention, either the type with importance attached to data backup in a single separate device or the type with importance attached to the stable operation of an entire system can be selected depending upon the objective and application. Also, since a simplified construction is realized where the conductive outer plates 2 and 3 of the portable semiconductor storage device are connected to the circuit ground 13 of the printed board 4, the assembly process can be simplified, resulting in an improvement in reliability and lowered costs.

In the above-described embodiment, the electrical connection between the conductive outer plates 2 and 3 is made by means of the conductive spring 12. However, any connection means by which the obverse and reverse conductive outer plates 2 and 3 are electrically connected may be used.

What is claimed is:

1. A portable semiconductor data storage device comprising:

a board on which semiconductor devices are mounted and including a circuit ground;

a pair of conductive outer plates disposed on opposite sides of said board;

means electrically connecting said conductive outer plates to each other; and first and second terminal members for respectively contacting positive and negative polarity terminals of a cell inserted into said device, said first terminal electrically connecting a first of the positive and negative polarity terminals of a cell to said conductive outer plates and the circuit ground when the cell is disposed between said first and second terminal members, said conductive outer plates being electrically disconnected from the circuit ground when the cell is not disposed between said first and second terminal members.

2. A portable semiconductor data storage device as claimed in claim 1 wherein said means electrically connecting said outer plates is an electrically conductive spring.

3. A portable semiconductor data storage device as claimed in claim 1 wherein said device is an extended memory.

4. A portable semiconductor data storage device as claimed in claim 1 wherein said first terminal member is a resilient member displaced when a cell is inserted between said first and second terminal members from a position spaced from one of said outer conductive plates to a position in contact with one of said outer conductive plates.

* * * * *